(12) United States Patent
Sparks et al.

(10) Patent No.: US 9,029,963 B2
(45) Date of Patent: May 12, 2015

(54) MEMS MICROPHONE

(71) Applicants: Andrew Sparks, Cambridge, MA (US); Todd M. Borkowski, Belmont, MA (US)

(72) Inventors: Andrew Sparks, Cambridge, MA (US); Todd M. Borkowski, Belmont, MA (US)

(73) Assignee: Sand 9, Inc., Cambridge, MA (US)

( * ) Notice: Subject to any disclaimer, the term of this patent is extended or adjusted under 35 U.S.C. 154(b) by 0 days.

(21) Appl. No.: 14/034,986

(22) Filed: Sep. 24, 2013

(65) Prior Publication Data
US 2014/0084395 A1 Mar. 27, 2014

Related U.S. Application Data

(60) Provisional application No. 61/705,299, filed on Sep. 25, 2012.

(51) Int. Cl.
| | |
|---|---|
| *H01L 29/84* | (2006.01) |
| *H01L 21/00* | (2006.01) |
| *B81B 3/00* | (2006.01) |
| *B81C 1/00* | (2006.01) |

(52) U.S. Cl.
CPC .......... *B81B 3/0018* (2013.01); *B81C 1/00158* (2013.01); *B81C 2201/0191* (2013.01); *B81B 2201/0257* (2013.01)

(58) Field of Classification Search
CPC .......................... B81B 3/0018; B81C 1/00158
USPC ...................... 257/419; 438/53; 381/113, 175
See application file for complete search history.

(56) References Cited

U.S. PATENT DOCUMENTS

| | | | | |
|---|---|---|---|---|
| 6,741,709 | B2 * | 5/2004 | Kay et al. | 381/175 |
| 7,247,246 | B2 * | 7/2007 | Nasiri et al. | 216/2 |
| 7,250,353 | B2 * | 7/2007 | Nasiri et al. | 438/460 |
| 8,039,910 | B2 * | 10/2011 | Yen et al. | 257/416 |
| 8,445,304 | B2 * | 5/2013 | Esfahany et al. | 438/50 |

* cited by examiner

*Primary Examiner* — William D Coleman
(74) *Attorney, Agent, or Firm* — Chapin IP Law, LLC

(57) ABSTRACT

Mechanical resonating structures, as well as related devices and methods of manufacture. The mechanical resonating structures can be microphones, each including a diaphragm and a piezoelectric stack. The diaphragm can have one or more openings formed therethrough to enable the determination of an acoustic pressure being applied to the diaphragm through signals emitted by the piezoelectric stack.

14 Claims, 9 Drawing Sheets

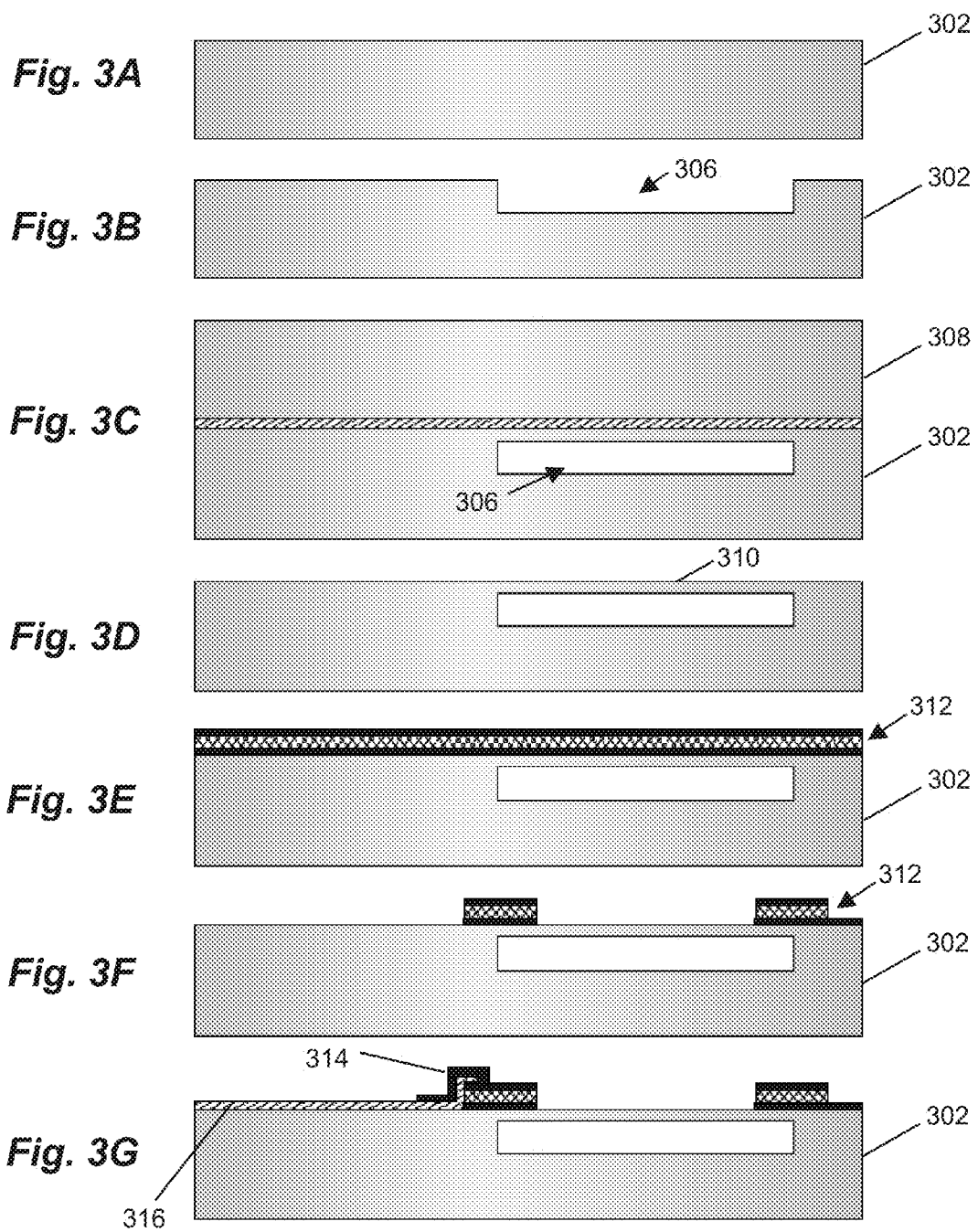

MEMS MICROPHONE

CROSS REFERENCE TO RELATED APPLICATIONS

This application claims benefit of the priority of U.S. Provisional Patent Application No. 61/705,299 filed Sep. 25, 2012 entitled MEMS MICROPHONE.

TECHNICAL FIELD

The present application relates generally to microphones, and more particularly to micro-electro-mechanical-systems (MEMS) microphones and methods of manufacturing MEMS microphones.

BACKGROUND

A microphone is an acoustic-to-electric converter (e.g., a transducer or sensor) that converts sound (i.e., acoustic pressure) into an electrical signal. Microphones can operate using a number of techniques including electromagnetic induction (e.g., as used in dynamic microphones) and capacitance change (e.g., as used in condenser microphones).

Many microphones being utilized today are condenser microphones, which typically feature a fixed electrode (also referred to herein as the "backplate") in close proximity to a moveable electrode (also referred to herein as the "diaphragm"). The backplate is typically rigid and is necessary because condenser microphones use electrostatic (i.e., capacitive) transduction between the diaphragm and the backplate to convert acoustic pressure into an electrical signal.

Condenser microphones typically use a small gap between the respective electrodes formed by the diaphragm and the backplate to achieve high signal-to-noise ratios (SNRs), frequently resulting in reliability challenges such as stiction. Such a small gap between the backplate and the diaphragm can also degrade the thermal-mechanical noise performance by damping the overall mechanical structure. Moreover, a DC bias between the backplate and the diaphragm is typically required to enable capacitive detection of motion. However, such a DC bias between the backplate and the diaphragm can be a significant source of power consumption.

A further consideration is whether condenser microphones (e.g., micro-electro-mechanical-systems (MEMS) condenser microphones) can be configured with a top port package configuration (also referred to herein as the "top port configuration") or a bottom port package configuration (also referred to herein as the "bottom port configuration"). In a top port configuration, a MEMS condenser microphone is typically soldered to a printed circuit board (PCB), and acoustic access to the MEMS condenser microphone is provided through a hole at the top of the package. In a bottom port configuration, acoustic access is provided through a hole in the bottom of the package. A bottom port configuration also generally requires a hole in the PCB to enable sound to reach the MEMS condenser microphone. Although such MEMS condenser microphones can be made in either a top or bottom port configuration, holes must typically be machined into the backplates, increasing fabrication complexity.

SUMMARY

Mechanical resonating structures, as well as related devices and methods of manufacture, are described herein. The mechanical resonating structures described herein are discussed with respect to microphones. However, the exemplary embodiments described herein, or one or more features thereof, can be used with any other suitable devices, including speakers.

One or more of the embodiments described herein can include a piezoelectric microphone having a membrane or diaphragm, and a piezoelectric stack. The membrane or diaphragm can have a configuration (e.g., through removal of material therefrom) that facilitates movement or vibration, including holes and/or trenches of various shapes and/or sizes. The membrane or diaphragm can be made from various material or combinations of material, such as silicon (Si), silicon dioxide ($SiO_2$), silicon nitride (SiN), and silicon carbide (SiC). As an example, the membrane or diaphragm can be an array of holes and/or an array of non-prismatic cantilevers. In one embodiment, the piezoelectric stack can be patterned so that the membrane is thinner in selected regions and the static capacitance is reduced. In another embodiment, a hole pattern can be selected to relieve or otherwise reduce stress of the membrane. In still another embodiment, the microphone can be formed without a backplate.

The microphone can be formed in various configurations including, but not limited to, a top port package configuration (also referred to herein as the "top port configuration") to obtain a top port wafer-level chip-scale package (WLCSP) microphone (featuring through-silicon vias (TSVs)), or a bottom port package configuration (also referred to herein as the "bottom port configuration") to obtain a bottom port WLCSP microphone (featuring TSVs). In one embodiment, a technique can be utilized to maintain the structural integrity of the membrane throughout the fabrication process by providing temporary structural pillars to keep the membrane stiff. In another embodiment, arrays of the microphones can be placed on a single chip.

Piezoelectricity offers high electromechanical coupling compared with electrostatic transduction, enabling superior or improved signal-to-noise ratios (SNRs) to be achieved with proper design.

In one embodiment of the present application, a method can include obtaining a starting wafer, forming vias and a cavity in the starting wafer, and bonding a silicon-on-insulator (SOI) wafer to the starting wafer. The method can also include removing material from at least one of the SOI wafer and the starting wafer to create a released diaphragm, depositing a piezoelectric stack in proximity to the released diaphragm, etching diaphragm holes in the released diaphragm to create a MEMS wafer, bonding the MEMS wafer to an integrated circuit wafer, and exposing the MEMS wafer to the ambient environment.

In another embodiment of the present application, a device can have a substrate, and a diaphragm over an opening in the substrate, wherein the diaphragm includes one or more openings therein. The diaphragm can also have a piezoelectric stack in proximity to the one or more openings, wherein the piezoelectric stack is connectable with a conductor for determining acoustic pressure applied to the diaphragm.

In a further embodiment of the present application, a microphone device can have a substrate having an opening, and a piezoelectric stack over the opening in the substrate. The piezoelectric stack has one or more openings therein, wherein the piezoelectric stack is connectable with a conductor for determining acoustic pressure applied thereto. The microphone device does not include a backplate. The piezoelectric stack can comprise a first metal layer, a second metal layer, and a piezoelectric layer disposed therebetween.

Other embodiments and features of the present application will become apparent from the following detailed description when considered in conjunction with the accompanying drawing figures.

BRIEF DESCRIPTION OF THE DRAWINGS

The accompanying drawing figures, which are incorporated in and constitute a part of this specification, illustrate one or more embodiments described herein and, together with the Detailed Description, explain these embodiments. In the drawing figures:

FIGS. 3A-3J show another process for manufacturing another MEMS microphone according to embodiments of the present application;

DETAILED DESCRIPTION

Figure 1A:
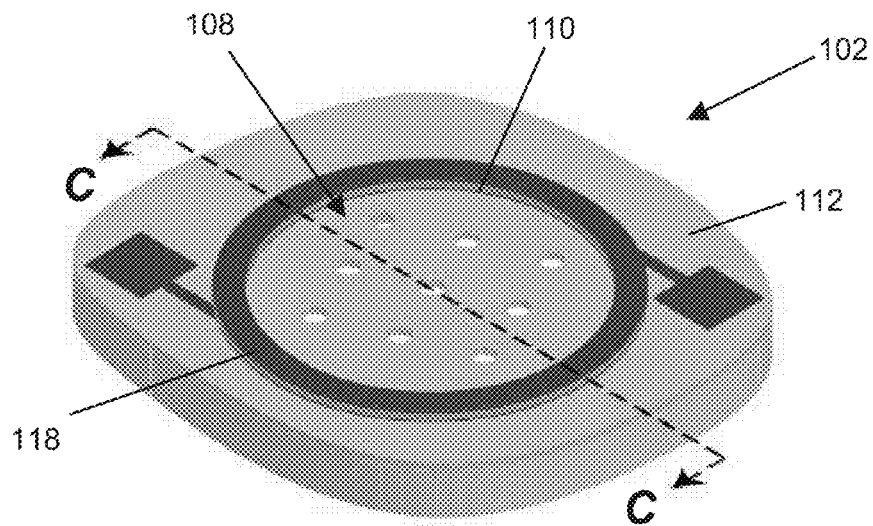
FIGS. 1A-1C show micro-electro-mechanical-systems (MEMS) microphones according to embodiments of the present application.

The disclosure of U.S. Provisional Patent Application No. 61/705,299 filed Sep. 25, 2012 entitled MEMS MICROPHONE is hereby incorporated herein by reference in its entirety.

In the drawing figures, the same reference numbers identify identical or substantially similar elements or acts. The drawing figures illustrate particular embodiments for the purpose of describing the present application, and are not intended to be exclusive or limiting in any way. The drawing figures are schematic and are not intended to be drawn to scale. In the drawing figures, each identical or substantially similar component illustrated in various figures is represented by a single numeral or notation. For purposes of clarity, not every component is labeled in every drawing figure, nor is every component of each embodiment of the present application shown where illustration is not necessary to allow those of ordinary skill in the art to understand the present application. It should be understood that various combinations of the structures, components, materials, and/or elements, other than those specifically shown, are contemplated and are within the scope of the present application.

Micro-electro-mechanical systems (MEMS) transducers are micrometer-scale transducers involving one or more mechanical elements. MEMS transducers can be used in various devices including devices for inertial sensing, pressure sensing, and filtering, devices that employ projection display technology, timing devices, or any other suitable devices. The exemplary embodiments also take into consideration whether a top port package configuration (also referred to herein as the "top port configuration") or a bottom port package configuration (also referred to herein as the "bottom port configuration") can be employed. In a top port configuration, a MEMS microphone is soldered to a printed circuit board (PCB), and acoustic access to the microphone is provided through a hole at the top of the package. In a bottom port configuration, access is provided through a hole in the bottom of the package. A bottom port configuration also generally requires a hole in the PCB to enable sound to reach the microphone. The exemplary embodiments are adaptable to either configuration so as to satisfy either requirement.

Figure 1B:
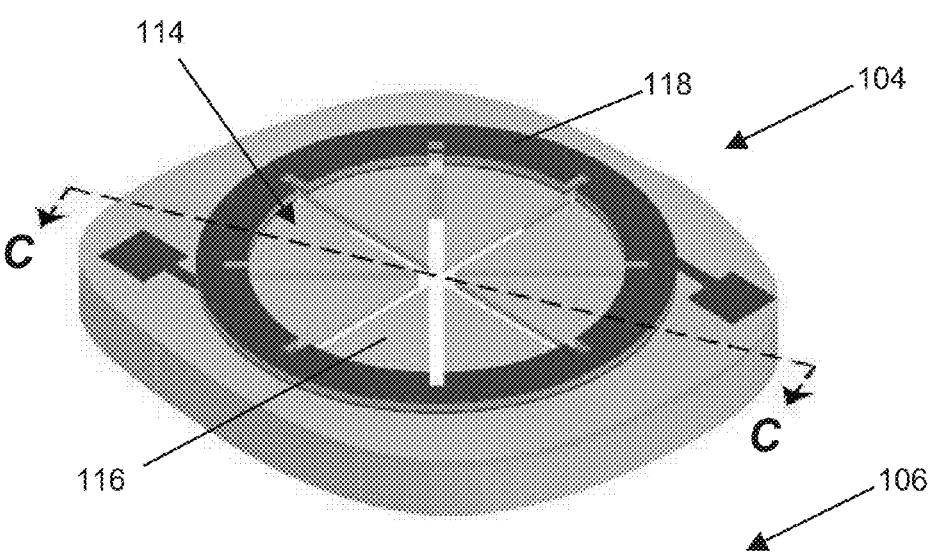
Figure 1C:
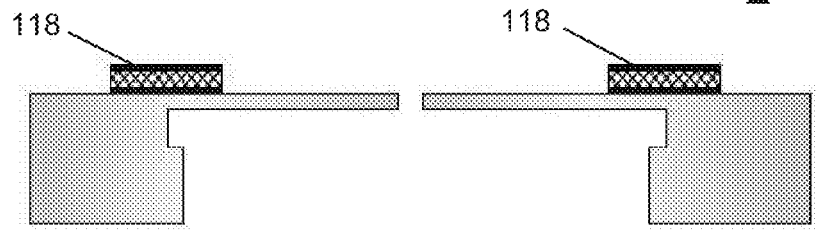

The direct piezoelectric effect refers to the ability of a piezoelectric material to generate an electric dipole moment in response to (and proportional to) an applied stress. Thus, a piezoelectric microphone design generates stress in the piezoelectric film under the application of acoustic pressure. Two exemplary embodiments 102, 104 are illustrated in FIGS. 1A and 1B, respectively, for a piezoelectric MEMS microphone. The embodiments 102, 104 share substantially the same sliced cross section 106, which is illustrated in FIG. 1C. FIGS. 1A-1C do not depict the package of the piezoelectric MEMS microphone, which is addressed later, but many different packages can be used with these designs.

In FIG. 1A, the mechanical element can be a silicon membrane or diaphragm 108 anchored around its perimeter 110 to a silicon substrate 112. In one embodiment, the membrane 108 is single crystal silicon, but it may alternatively be poly-silicon, silicon dioxide ($SiO_2$), silicon nitride (SiN), silicon carbide (SiC), or some combination of these materials in a multilayer stack. On top of the membrane 108, a metal-piezoelectric-metal transducer stack 118 (see FIG. 1C) is deposited and patterned. The piezoelectric film of the transducer stack 118 may be made of various materials, including aluminum nitride (AlN), zinc oxide (ZnO), cadmium sulfide (CdS), quartz, lead titanate ($PbTiO_3$), lead zirconate titanate (PZT), lithium niobate ($LiNbO_3$), lithium tantalate ($LiTaO_3$), or any other suitable material. The metal of the transducer stack 118 may be aluminum (Al), molybdenum (Mo), titanium (Ti), chromium (Cr), ruthenium (Ru), gold (Au), platinum (Pt), AlSiCu, or any other suitable material. The patterning of the transducer stack 118 concentrates the stack at the perimeter 110 where most of the stress is generated. This provides at least two advantages: 1) the overall membrane 108 thickness decreases over most of the area, resulting in more deflection per unit acoustic pressure, and 2) the static capacitance of the transducer stack 118 is reduced or minimized, which results in a higher signal-to-noise ratio (SNR). However, other embodiments can be utilized which do not use this stack patterning.

Figure 1D:
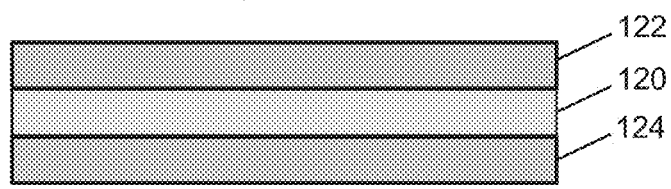
FIG. 1D shows a transducer stack that includes a compensating structure, for use in the MEMS microphones of FIGS. 1A-1C.

In one embodiment, the transducer stack 118 can have an active layer 120, and a compensating structure including at least one of a first layer 122 and a second layer 124 coupled to the active layer 120, as shown in FIG. 1D. The first layer 122 can have a stiffness that increases with increasing temperature over at least a first temperature range. Likewise, the second layer 124 can have a stiffness that increases with increasing temperature over at least the first temperature range. As further shown in FIG. 1D, the active layer 120 is disposed between the first layer 122 and the second layer 124. The compensating structure may be configured to provide a desired stiffness variation of the mechanical resonating structure and/or frequency of operation variation of the mechanical resonating structure over a desired temperature range (e.g., an anticipated operational temperature range of the mechanical resonating structure) for one or more modes of vibration of interest. In some embodiments, the composition of the active layer 120 of the transducer stack 118 may be considered in configuring the compensating structure, as the composition of the active layer 120 may impact the stiffness variation of the active layer 120 with temperature, which is to be compensated by the compensating structure in some embodiments.

According to one embodiment, the compensating structure may be configured to provide the mechanical resonating structure with a temperature coefficient of frequency (TCF) having an absolute value of less than approximately 1 ppm/K over a temperature range of at least 40° C. centered around room temperature (25° C.) for one or more modes of Lamb waves when the active layer 120 is formed of aluminum nitride (AlN). However, this is merely a non-limiting example provided for purposes of illustration.

The embodiment 104 of FIG. 1B depicts a membrane or diaphragm 114 similar to FIG. 1A, but with long slits etched through its thickness instead of holes. In effect, this embodiment 104 is an array of non-prismatic cantilevers 116 with the piezoelectric stack 118 covering the bases, again where stress is the highest. This embodiment can also reduce sensitivity to package stresses.

In general, there is similar acoustic pressure across each of the cantilevers 116. In one embodiment, stress across different cantilevers 116 or other regions of the diaphragm 114 can be compared, such as to confirm the accuracy of the stress detected. In another embodiment, the stress at different cantilevers 116 or regions of the diaphragm 114 can be compared to determine an angle or direction of the sound that is applying the acoustic pressure to the diaphragm 114. In one embodiment, each region of the diaphragm 114 (e.g., the cantilevers 116) can be separately connected with wiring or a conductor (e.g., a conductor 214, FIG. 2H, or a conductor 314, FIG. 3G) for detecting separate vibrations. In another embodiment, a single wire can be used for connecting with the various regions of the diaphragm 114.

Figure 2A:
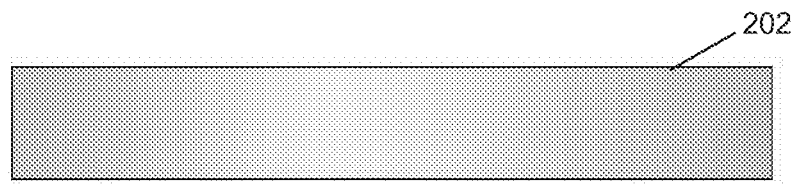
FIGS. 2A-2M show a process for manufacturing a MEMS microphone according to embodiments of the present application.
Figure 2B:
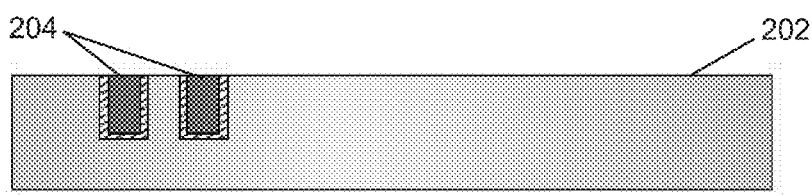
Figure 2C:
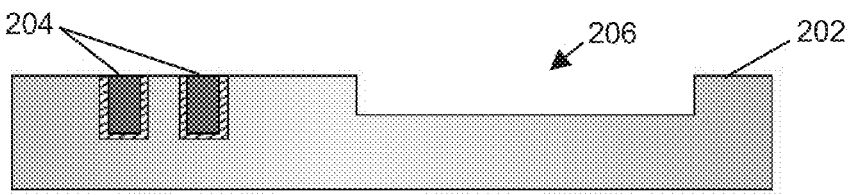
Figure 2D:
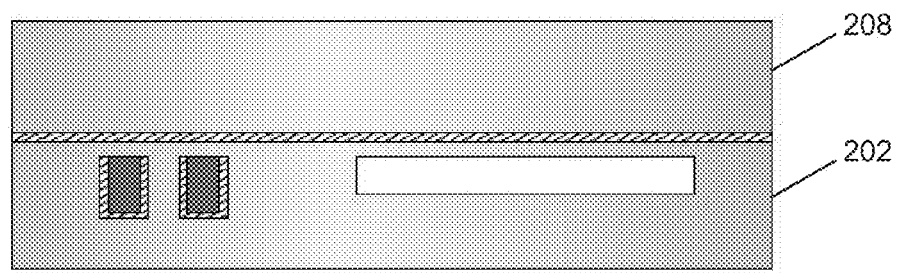
Figure 2E:
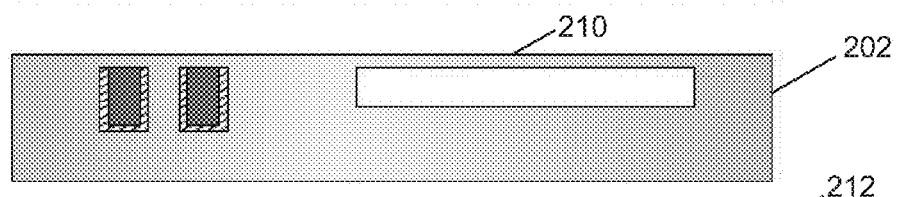
Figure 2F:
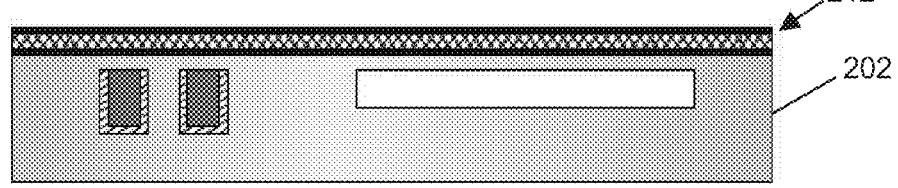
Figure 2G:
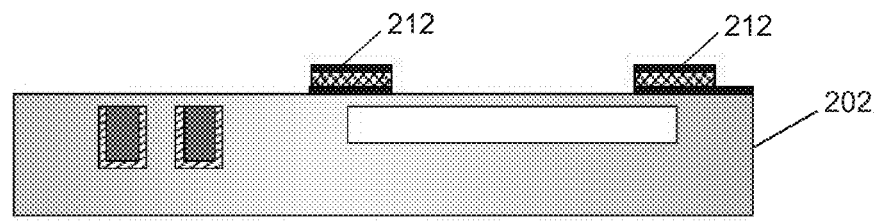
Figure 2H:
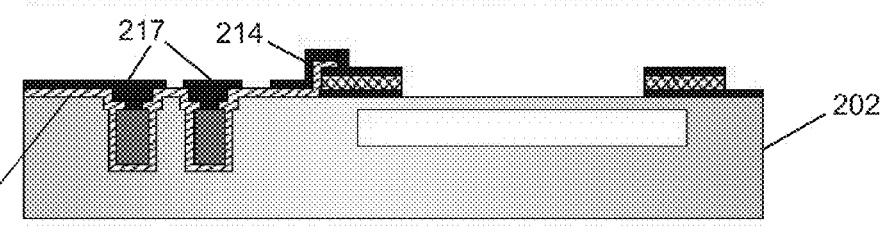
Figure 2I:
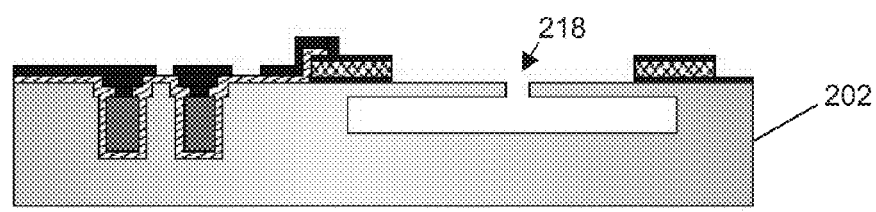
Figure 2J:
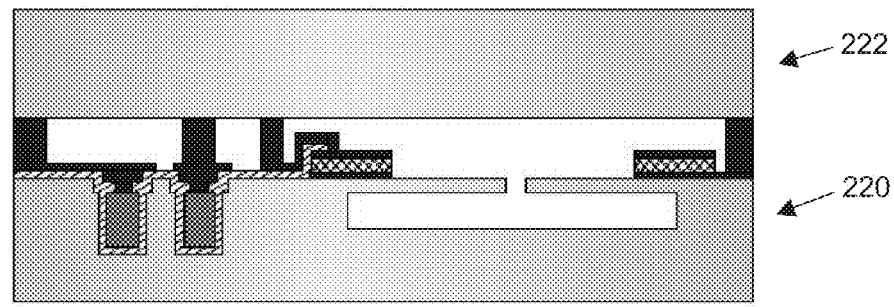
Figure 2K:
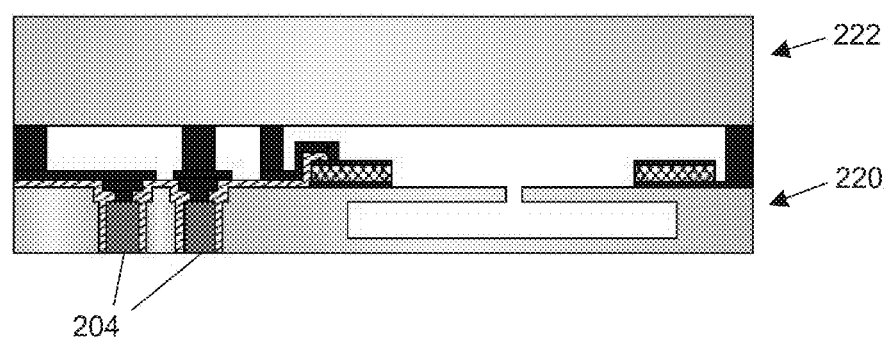
Figure 2L:
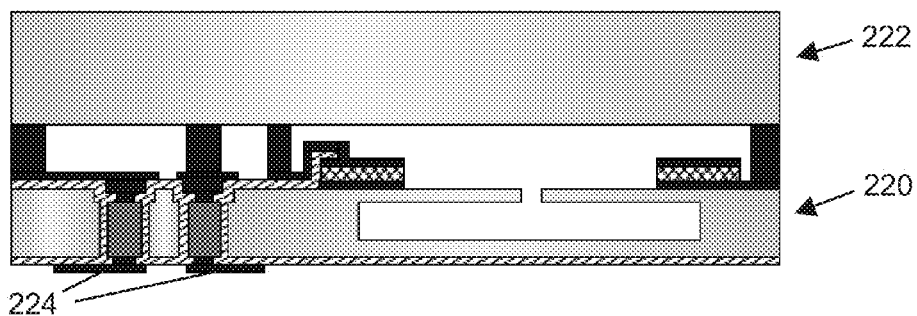
Figure 2M:
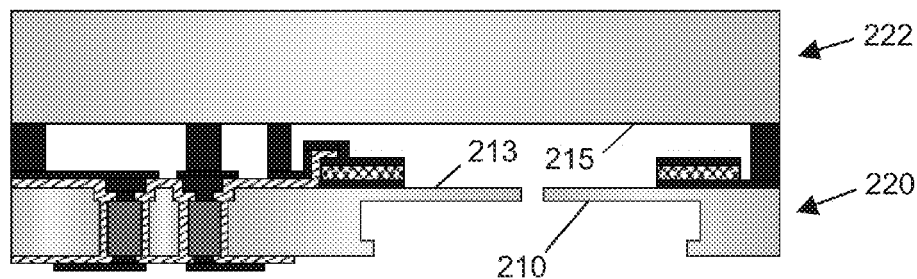

FIGS. 2A-2M show cross sections of an exemplary process flow to manufacture a microphone in a bottom port configuration of either type of embodiment 102, 104 (see FIGS. 1A, 1B) described above (or other configurations) in a wafer-level chip-scale package (WLCSP), which has through-silicon vias (TSVs). In FIG. 2A, a starting wafer 202 can be silicon. TSVs 204 (see FIG. 2B) can be formed in the starting wafer 202, and a cavity 206 (see FIG. 2C) can be etched where the microphone is to be located. A silicon-on-insulator (SOI) wafer 208 (see FIG. 2D) can be bonded to the starting wafer 202 and ground, polished, and/or etched back to create a released diaphragm 210 (see FIG. 2E) made of silicon, or whatever material or material stack is transferred from the top of the SOI wafer 208. A piezoelectric stack 212 (see FIG. 2F) can then be deposited, patterned, and etched (see FIG. 2G). Electrical connections 214, 217 and passivation 216 (see FIG. 2H) can be created using any suitable technique known to those skilled in micro-fabrication technology. Diaphragm holes 218 (see FIG. 2I) can be etched. Further, the resulting MEMS wafer 220 (see FIG. 2J) can be bonded to an integrated circuit (IC) wafer 222 (see FIG. 2J) using any suitable known metal bonding techniques. The MEMS wafer 220 can be ground from the backside to expose the TSVs 204 (see FIG. 2K), which can then be passivated and patterned with metal 224 (see FIG. 2L). The microphone including the released diaphragm 210 and the piezoelectric stack 212 (see FIG. 2M) can be exposed to the ambient environment through grinding, polishing, reactive ion etching (RIE), or some combination of the above. The microphone package can be soldered to a PCB or assembled in a multi-chip module (MCM) with the MEMS wafer facing down.

A similar approach can be used to manufacture a microphone in a top port configuration, as depicted in FIGS. 3A-3J. The fabrication process is substantially the same as depicted in FIGS. 2A-2M except that the TSVs are created in the IC wafer, not in the MEMS wafer.

Figure 3H:
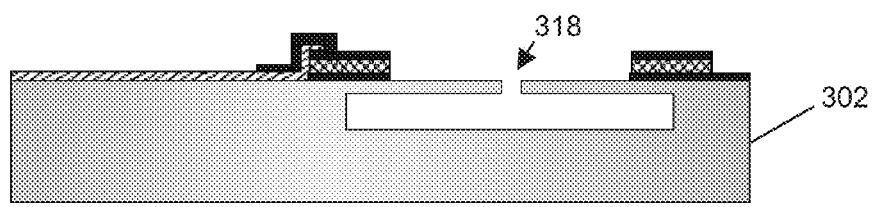
Figure 3I:
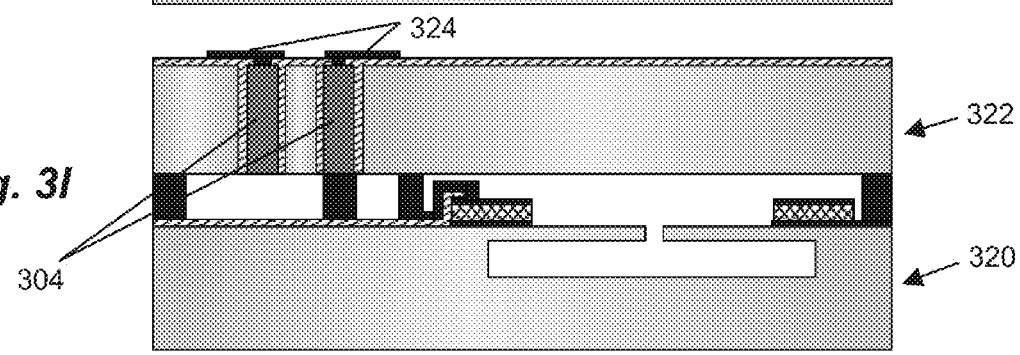
Figure 3J:
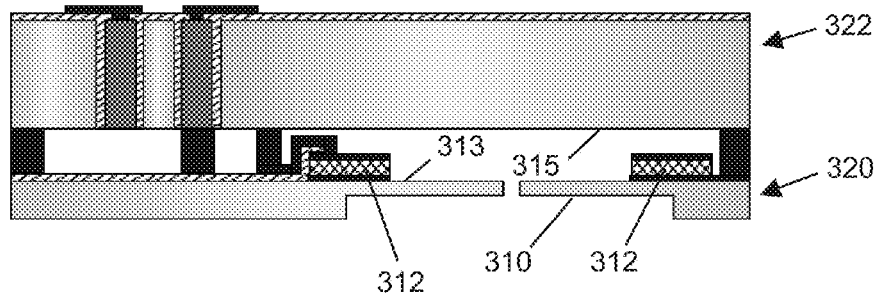
Figure 4A:
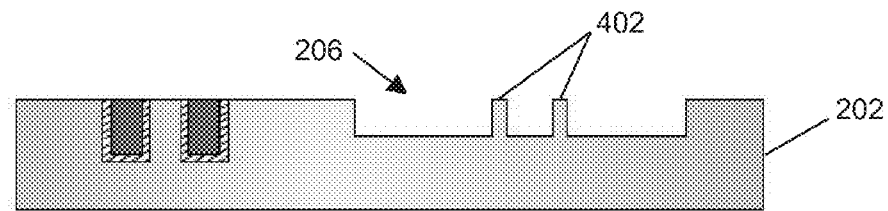
FIGS. 4A-4G show still another process for manufacturing still another MEMS microphone according to embodiments of the present application.
Figure 4B:
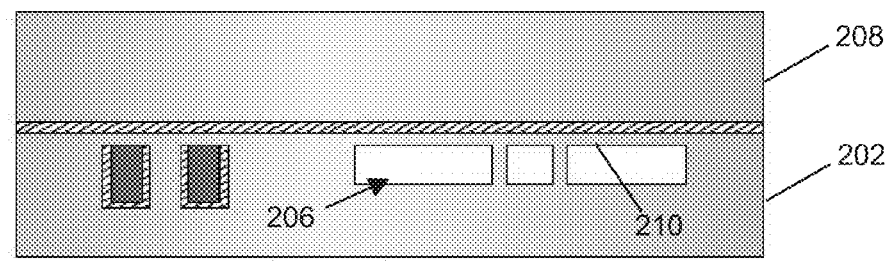
Figure 4C:
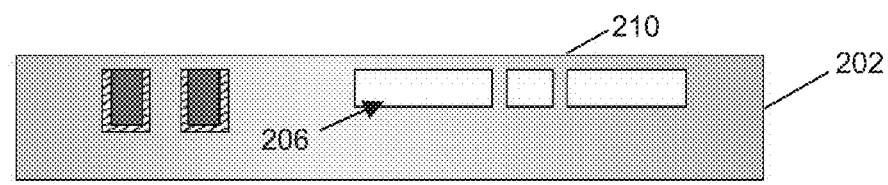
Figure 4D:
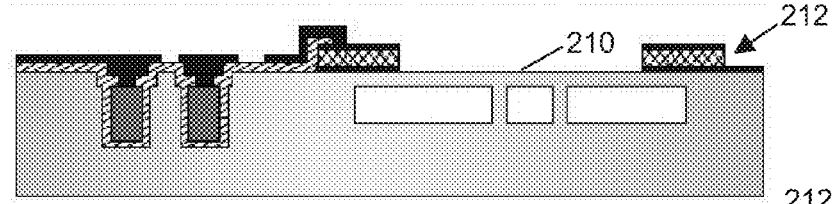
Figure 4E:
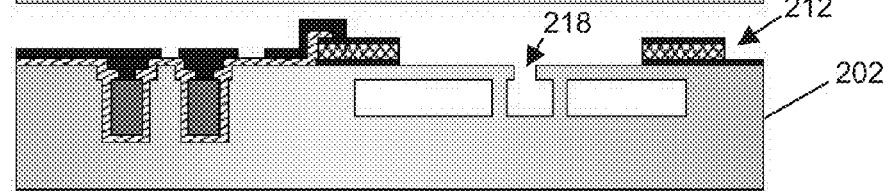
Figure 4F:
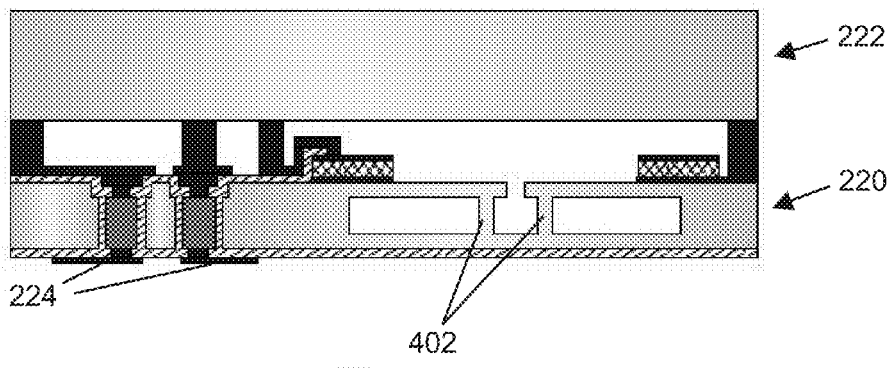
Figure 4G:
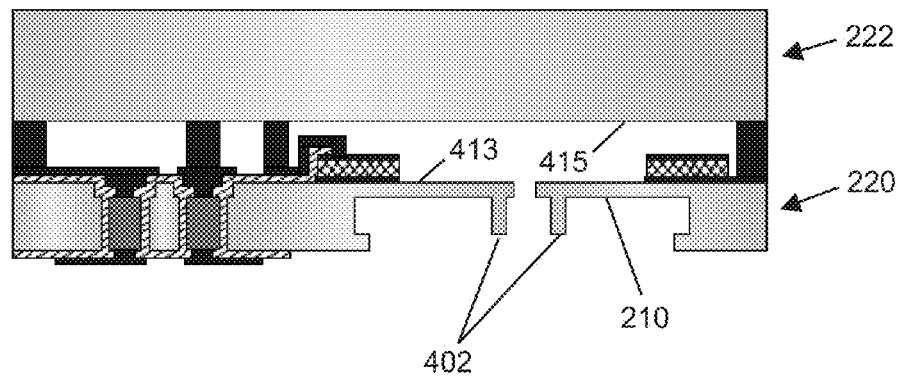

In FIG. 3A, a starting wafer 302 can be silicon. A cavity 306 (see FIG. 3B) can be etched where the microphone is to be located. An SOI wafer 308 (see FIG. 3C) can be bonded to the starting wafer 302 and ground, polished, and/or etched back to create a released diaphragm 310 (see FIG. 3D) made of silicon, or whatever material or material stack is transferred from the top of the SOI wafer 308. A piezoelectric stack 312 (see FIG. 3E) can then be deposited, patterned, and etched (see FIG. 3F). Electrical connections 314 and passivation 316 (see FIG. 3G) can be created using any suitable technique known to those skilled in micro-fabrication technology. Diaphragm holes 318 (see FIG. 3H) can be etched. Further, the resulting MEMS wafer 320 (see FIG. 3I) can be bonded to an integrated circuit (IC) wafer 322 (see FIG. 3I) using any suitable known metal bonding techniques. TSVs 304 (see FIG. 3I) can be created in the IC wafer 322, and passivated and patterned with metal 324 (see FIG. 3I). The microphone including the released diaphragm 310 and the piezoelectric stack 312 (see FIG. 3J) can be exposed to the ambient environment through grinding, polishing, reactive ion etching (RIE), or some combination of the above. The microphone package can be soldered to a PCB or assembled in a multi-chip module (MCM).

One potential issue in MEMS microphone manufacturing is that the membrane is often created early in the process (such as the processes of FIGS. 2A-2M and 3A-3J), and may be susceptible to shock-induced stiction and/or breakage during the remaining portion of the process flow. To reduce the risk of stiction or other undesirable results of the manufacturing process, FIGS. 4A-4G illustrate a manufacturing process using one or more temporary support structures 402, which can apply to either embodiments 102, 104 of FIGS. 1A and B without changing the principle of operation or manufacturing process. Here, the various elements depicted in FIGS. 4A, 4B, 4C, 4D, 4E, 4F, and 4G correspond to the matching elements depicted FIGS. 2C, 2D, 2E, 2H, 2I, 2L, and 2M, respectively, with the addition of the support structures 402 (see FIGS. 4A-4G).

During the etch of the cavity 206 (see FIG. 4A), the support structures 402 (also referred to herein as "structural pillars") can be defined. After bonding (see FIG. 4B) and grinding/polishing (see FIG. 4C), the membrane or diaphragm 210 can be propped up or otherwise supported by the structural pillars 402, resulting in a dramatically stiffer membrane 210 (during the remaining portion of the manufacturing process) with superior mechanical robustness. After routing (see FIG. 4D) and release (see FIG. 4E), the structural pillars 402 can be removed by the hole 218 etch. Alternatively, they can remain intact to help the membrane 210 survive bonding and metallization (see FIG. 4F). During the final membrane exposure polish or etch (see FIG. 4G), the structural pillars 402 become released from their support and are free to move with the membrane 210. Though the structural pillars 402 remain attached to the membrane 210 in the illustrated embodiment, they have little effect on its mechanical properties and can be tolerated during microphone operation. The structural pillars 402 can be of various shapes including pins, rings, or any other suitable shapes.

Figure 5:
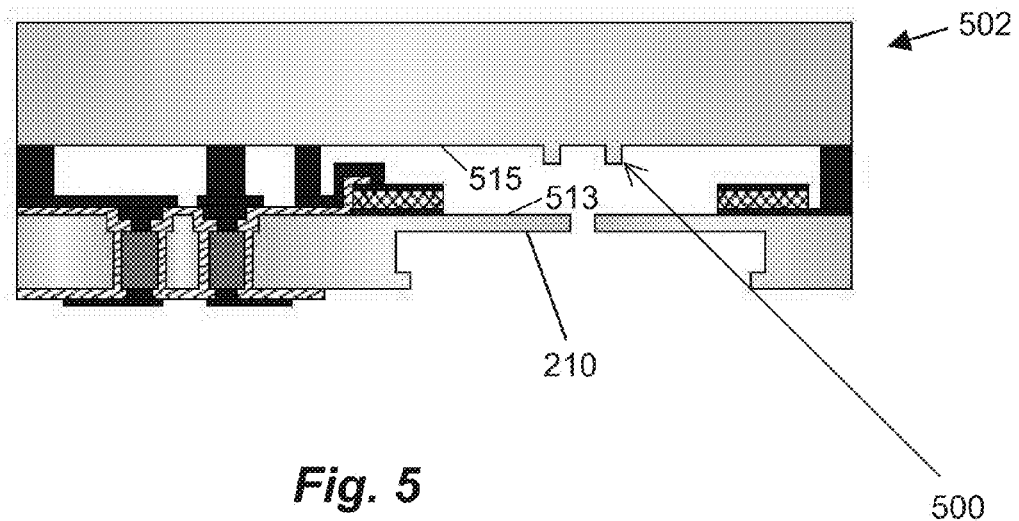
FIG. 5 shows yet another MEMS microphone according to embodiments of the present application.

FIG. 5 illustrates another embodiment 502 of the MEMS microphone. The various elements depicted in FIG. 5 correspond to the matching elements depicted in FIG. 4G, respectively, with the exception that the structural pillars 402 (see FIG. 4G) are removed and replaced with structural pillars 500 (see FIG. 5), which are formed on the other side of the diaphragm 210. In this embodiment 502, the structural pillars 500 can help avoid reflection interference, as well as avoid stiction during the manufacturing process.

Figure 6:
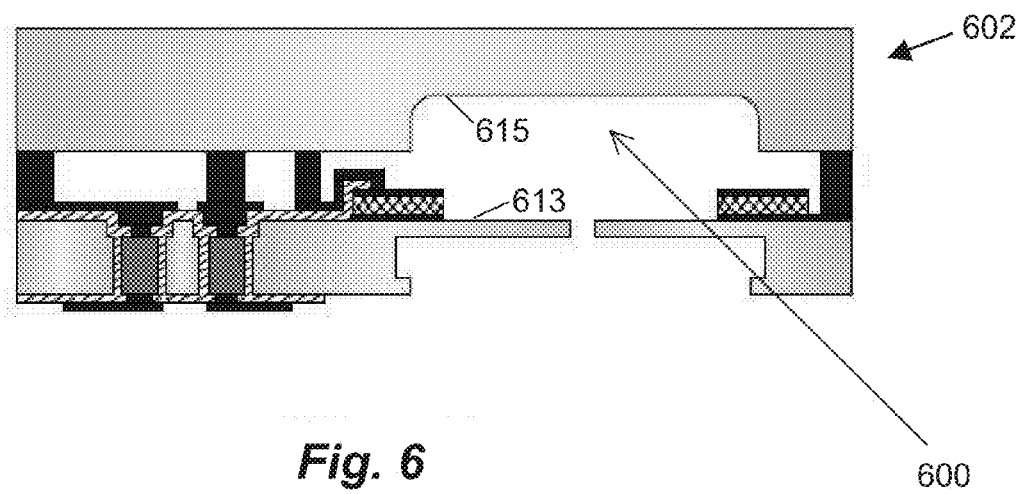
FIG. 6 shows a further MEMS microphone according to embodiments of the present application.

FIG. 6 illustrates a further embodiment 602 of the MEMS microphone. The various elements depicted in FIG. 6 correspond to the matching elements depicted in FIG. 4G, respectively, with the exception that the structural pillars 402 (see FIG. 4G) are removed, and a backside cavity 600 is utilized to reduce or eliminate reflection interference. The use of the backside cavity 600 can depend on the operational parameters or the expected operating environment of the MEMS microphone where reflection interference may be a potential operational issue.

In one or more of the embodiments depicted in FIGS. 2M, 3J, 4G, 5, and 6, a coating can be applied to the backside 213, 313, 413, 513, 613 of the diaphragm and/or the surface of the structure 215, 315, 415, 515, 615 opposing the backside 213, 313, 413, 513, 613, respectively, of the diaphragm. The coating can be made of a material that reduces or eliminates stiction.

The exemplary embodiments illustrate circular openings in the diaphragm and slits forming pie-shaped cantilever structures in the diaphragm. The exemplary embodiments can utilize various other shapes of openings through the diaphragm. The selection of the opening shapes can be based on a number of factors, such as the expected stress levels, amount of expected acoustic pressure, and so forth. In one embodiment, the cantilever structures can be rectangular-like structures in a parallel pattern. In another embodiment, the pattern resulting from the openings through the diaphragm can be a symmetrical pattern or an asymmetrical pattern. In another embodiment, the pattern resulting from the openings through the diaphragm can be an annular pattern, such as circular holes formed in concentric rings.

The exemplary embodiment is described with respect to a three layer piezoelectric stack, but other piezoelectric stacks, including other numbers of layers can also be used with the exemplary embodiments.

In one embodiment, the MEMS microphone can allow for direct vibration (and measurement) of the piezoelectric material (without the need for a separate diaphragm). For example, the piezoelectric stack can function as the diaphragm and can have one or more openings formed therethrough to facilitate vibration in response to the application of acoustic pressure. The one or more openings can be of various sizes, shapes, and configurations, including the cantilevers or circular openings. In this example, the stack can be a metal-piezoelectric-metal transducer stack. The piezoelectric film of the transducer stack may be made of various materials including aluminum nitride (AlN), zinc oxide (ZnO), cadmium sulfide (CdS), quartz, lead titanate ($PbTiO_3$), lead zirconate titanate (PZT), lithium niobate ($LiNbO_3$), lithium tantalate ($LiTaO_3$), combinations thereof, or some other material. The metal of the transducer stack may be aluminum (Al), molybdenum (Mo), titanium (Ti), chromium (Cr), ruthenium (Ru), gold (Au), platinum (Pt), AlSiCu, combinations thereof or some other material.

In another embodiment, the piezoelectric stack can be formed in a shape other than a ring. For example, the piezoelectric stack can be formed over the diaphragm, and the cutting to form the desired openings and other structures can also be applied to the piezoelectric stack.

In one or more of the exemplary embodiments, the piezoelectric layer for the piezoelectric stack can comprise quartz, $LiNbO_3$, $LiTaO_3$, aluminum nitride (AlN), or any other suitable piezoelectric material (e.g., zinc oxide (ZnO), cadmium sulfide (CdS), lead titanate ($PbTiO_3$), lead zirconate titanate (PZT), potassium niobate ($KNbO_3$), $Li_2B_4O_7$, langasite ($La_3Ga_5SiO_{14}$), gallium arsenside (GaAs), barium sodium niobate, bismuth germanium oxide, indium arsenide, indium antimonide), either in substantially pure form or in combination with one or more other materials. In one or more exemplary embodiments, the piezoelectric layer can be formed along a first metal layer. In one or more exemplary embodiments, the piezoelectric layer can be formed along first and second metal layers, such as sandwiched between the metal layers or arranged in a different layer configuration.

It should be understood that the various embodiments shown in the drawing figures are illustrative representations, and are not necessarily drawn to scale. Reference throughout the specification to "one embodiment" or "an embodiment" or "some embodiments" means that a particular feature, structure, material, or characteristic described in connection with the embodiment(s) is included in at least one embodiment of the present application, but not necessarily in all embodiments. Consequently, appearances of the phrases "in one embodiment", "in an embodiment", or "in some embodiments" in various places throughout the specification are not necessarily referring to the same embodiment. Furthermore, the particular features, structures, materials, or characteristics can be combined in any suitable manner in one or more embodiments, including through combining of embodiments.

Unless the context clearly requires otherwise, throughout the disclosure, the words "comprise", "comprising", and the like are to be construed in an inclusive sense as opposed to an exclusive or exhaustive sense; that is to say, in a sense of "including, but not limited to". Words using the singular or plural number also include the plural or singular number respectively. Additionally, the words "herein", "hereunder", "above", "below", and words of similar import refer to the present application as a whole and not to any particular portions of the present application. When the word "or" is used in reference to a list of two or more items, that word covers all of the following interpretations of the word: any of the items in the list; all of the items in the list; and, any combination of the items in the list.

Having thus described several embodiments of the present application, it is to be appreciated that various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawing figures are by way of example only, and the invention should not be viewed as limited except as by the scope and spirit of the appended claims.

What is claimed is:

1. A method, comprising:
   obtaining a first wafer;
   forming vias and a cavity in the first wafer;
   bonding a silicon-on-insulator (SOI) wafer to the first wafer;
   removing material from at least one of the SOI wafer and the first wafer to create a released diaphragm;
   depositing a piezoelectric stack in proximity to the released diaphragm;
   etching diaphragm holes in the released diaphragm to create a micro-electro-mechanical-systems (MEMS) wafer;
   bonding the MEMS wafer to an integrated circuit wafer; and
   exposing the MEMS wafer to an ambient environment.

2. The method of claim 1, wherein the exposing of the MEMS wafer includes at least one of grinding, polishing, and reactive ion etching the MEMS wafer.

3. The method of claim 1, comprising forming one or more support structures on the diaphragm.

4. A microphone, comprising:
a substrate;
a diaphragm disposed over an opening in the substrate, wherein the diaphragm includes one or more openings therein; and
a piezoelectric stack in proximity to the one or more openings in the diaphragm,
wherein the piezoelectric stack is connectable with a conductor for determining acoustic pressure applied to the diaphragm,
wherein the microphone does not include a backplate, and
wherein the diaphragm has variable thickness.

5. The microphone of claim 4, wherein the piezoelectric stack is a ring that surrounds the one or more openings in the diaphragm.

6. The microphone of claim 4, wherein the microphone is connected with an integrated circuit to form one of a top port wafer-level chip-scale package (WLCSP) configuration and a bottom port WLCSP configuration.

7. The microphone of claim 4, wherein the one or more openings in the diaphragm are circular openings.

8. The microphone of claim 4, wherein the diaphragm comprises one of silicon (Si), silicon dioxide ($SiO_2$), silicon nitride (SiN), silicon carbide (SiC), or combinations thereof.

9. The microphone of claim 4, wherein the one or more openings in the diaphragm are disposed in a symmetrical pattern.

10. A microphone, comprising:
a substrate;
a diaphragm disposed over an opening in the substrate, wherein the diaphragm includes one or more openings therein; and
a piezoelectric stack in proximity to the one or more openings in the diaphragm,
wherein the piezoelectric stack is connectable with a conductor for determining acoustic pressure applied to the diaphragm,
wherein the microphone does not include a backplate, and
wherein the one or more openings in the diaphragm define a plurality of cantilevers in the diaphragm.

11. A microphone, comprising:
a substrate;
a diaphragm disposed over an opening in the substrate, wherein the diaphragm includes one or more openings therein; and
a piezoelectric stack in proximity to the one or more openings in the diaphragm,
wherein the piezoelectric stack is connectable with a conductor for determining acoustic pressure applied to the diaphragm,
wherein the microphone does not include a backplate, and
wherein the one or more openings in the diaphragm are non-circular openings.

12. A microphone, comprising:
a substrate;
a diaphragm disposed over an opening in the substrate, wherein the diaphragm includes one or more openings therein; and
a piezoelectric stack in proximity to the one or more openings in the diaphragm,
wherein the piezoelectric stack is connectable with a conductor for determining acoustic pressure applied to the diaphragm,
wherein the microphone does not include a backplate, and
wherein the one or more openings in the diaphragm are disposed in an asymmetrical pattern.

13. A microphone, comprising:
a substrate;
a diaphragm disposed over an opening in the substrate, wherein the diaphragm includes one or more openings therein; and
a piezoelectric stack in proximity to the one or more openings in the diaphragm,
wherein the piezoelectric stack is connectable with a conductor for determining acoustic pressure applied to the diaphragm,
wherein the microphone does not include a backplate, and
wherein the piezoelectric stack comprises a first metal layer and a piezoelectric layer, wherein the piezoelectric layer comprises one of aluminum nitride (AlN), zinc oxide (ZnO), cadmium sulfide (CdS), quartz, lead titanate ($PbTiO_3$), lead zirconate titanate (PZT), lithium niobate ($LiNbO_3$), lithium tantalate ($LiTaO_3$), rand combinations thereof, and wherein the first metal layer comprises one of aluminum (Al), molybdenum (Mo), titanium (Ti), chromium (Cr), ruthenium (Ru), gold (Au), platinum (Pt), AlSiCu, and combinations thereof.

14. The microphone of claim 13, wherein the piezoelectric stack further comprises a second metal layer, wherein the second metal layer comprises one of aluminum (Al), molybdenum (Mo), titanium (Ti), chromium (Cr), ruthenium (Ru), gold (Au), platinum (Pt), AlSiCu, and combinations thereof.

* * * * *